(12) United States Patent
Luyken et al.

(10) Patent No.: US 7,368,752 B2
(45) Date of Patent: May 6, 2008

(54) DRAM MEMORY CELL

(75) Inventors: Richard J. Luyken, München (DE); Franz Hofmann, München (DE); Lothar Risch, Neubiberg (DE); Dirk Manger, Dresden (DE); Wolfgang Rösner, Ottobrunn (DE); Till Schlösser, Dresden (DE); Michael Specht, München (DE)

(73) Assignee: Infineon Technologies AG, Munich (DE)

( * ) Notice: Subject to any disclaimer, the term of this patent is extended or adjusted under 35 U.S.C. 154(b) by 179 days.

(21) Appl. No.: 10/839,800

(22) Filed: May 6, 2004

(65) Prior Publication Data

US 2004/0266088 A1 Dec. 30, 2004

(30) Foreign Application Priority Data

May 7, 2003 (DE) ................ 103 20 239

(51) Int. Cl.
*H01L 27/108* (2006.01)
*H01L 29/12* (2006.01)
*H01L 31/112* (2006.01)

(52) U.S. Cl. .......... 257/71; 257/68; 257/E27.084; 257/E21.646

(58) Field of Classification Search ............ 257/68, 257/71, E27.084, E21.646; 438/142
See application file for complete search history.

(56) References Cited

U.S. PATENT DOCUMENTS

| | | | |
|---|---|---|---|
| 4,569,036 A * | 2/1986 | Fujii et al. ............ | 365/230.03 |
| 5,428,241 A * | 6/1995 | Terashima ............... | 257/409 |
| 5,437,762 A | 8/1995 | Ochiai et al. | |
| 6,127,702 A * | 10/2000 | Yamazaki et al. ........ | 257/347 |
| 6,384,439 B1 * | 5/2002 | Walker ................ | 257/296 |
| 6,479,852 B1 * | 11/2002 | Wu ..................... | 257/301 |
| 6,525,403 B2 * | 2/2003 | Inaba et al. ........... | 257/618 |
| 2004/0147074 A1* | 7/2004 | Sell et al. ............ | 438/243 |

OTHER PUBLICATIONS

Ben G. Streetman and Sanjay Banerjee, Solid State Electronic Devices, 2000, Prentice Hall, Fifth Edition, pp. 464-470.*
Chenming Hu, "SOI and Nanoscale MOSFETs," Device Research Conference, 2001, Jun. 25-27, 2001 pp. 3-4.
Tai-su Park et al., "A 40 nm body-tied FinFET (Omega Mosfet) using bulk Si wafer"; Physica E 19 (2003) 6-12.

* cited by examiner

Primary Examiner—Matthew Smith
Assistant Examiner—Jarrett J Stark
(74) Attorney, Agent, or Firm—Morrison & Foerster LLP

(57) ABSTRACT

A DRAM memory cell is provided with a selection transistor, which is arranged horizontally at a semiconductor substrate surface and has a first source/drain electrode, a second source/drain electrode, a channel layer arranged between the first and the second source/drain electrode in the semiconductor substrate, and a gate electrode, which is arranged along the channel layer and is electrically insulated from the channel layer, a storage capacitor, which has a first capacitor electrode and a second capacitor electrode, insulated from the first capacitor electrode, one of the capacitor electrodes of the storage capacitor being electrically conductively connected to one of the source/drain electrodes of the selection transistor, and a semiconductor substrate electrode on the rear side, the gate electrode enclosing the channel layer at at least two opposite sides.

13 Claims, 9 Drawing Sheets

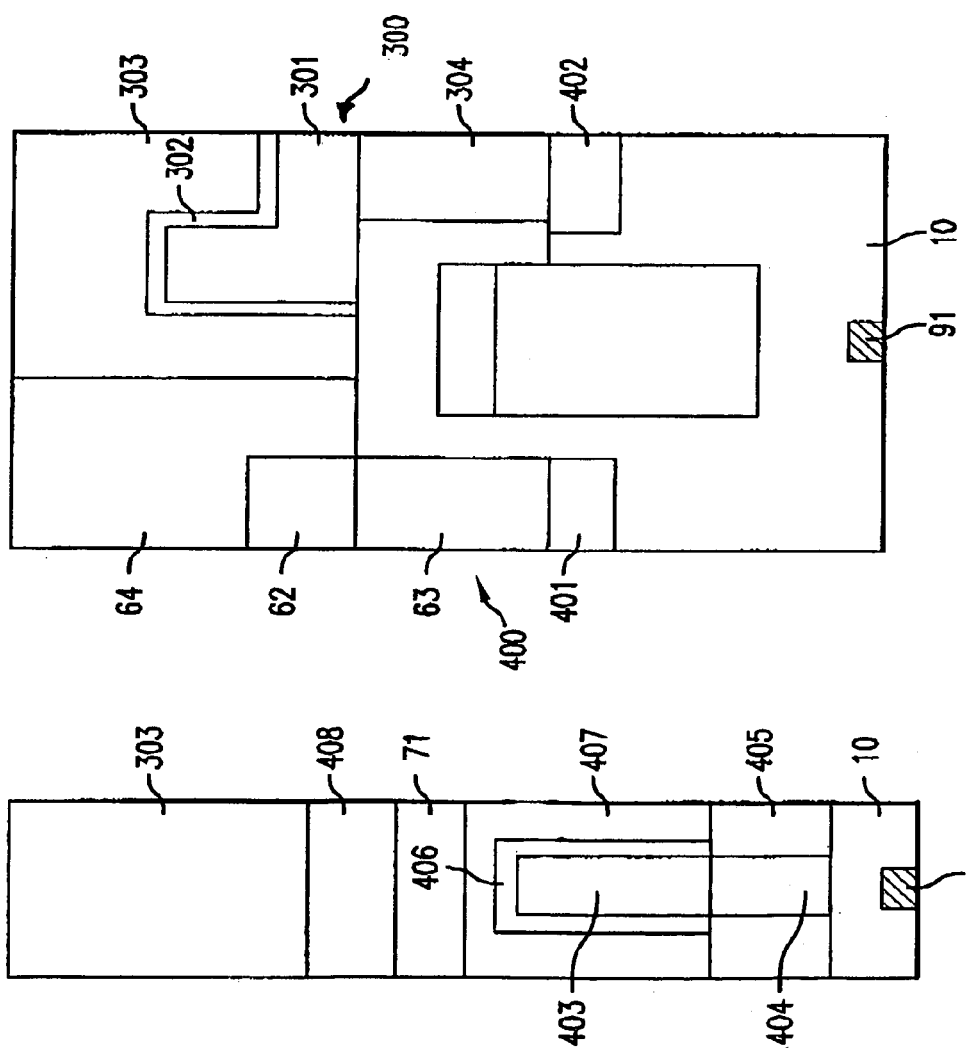

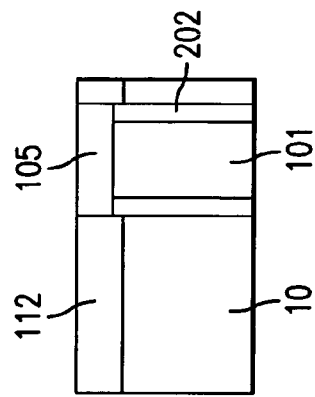
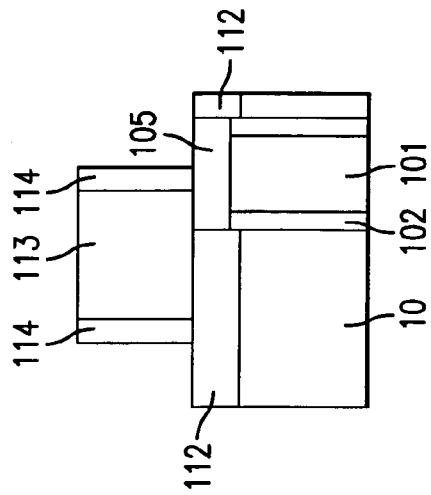
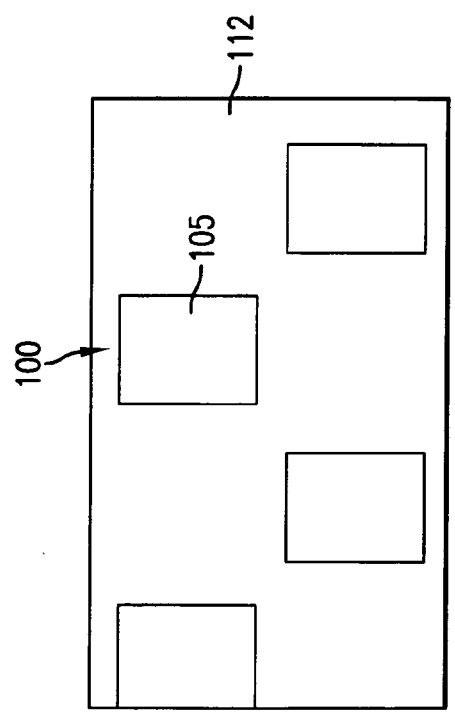
FIG.6A
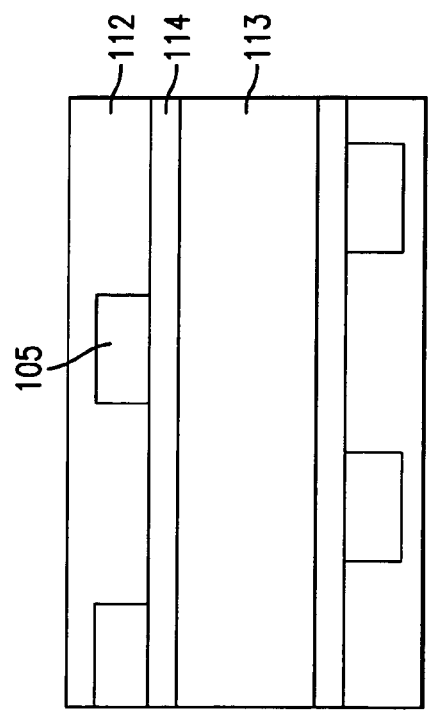
FIG.6B

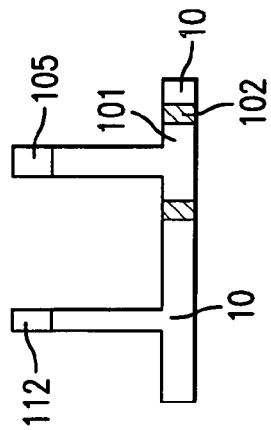
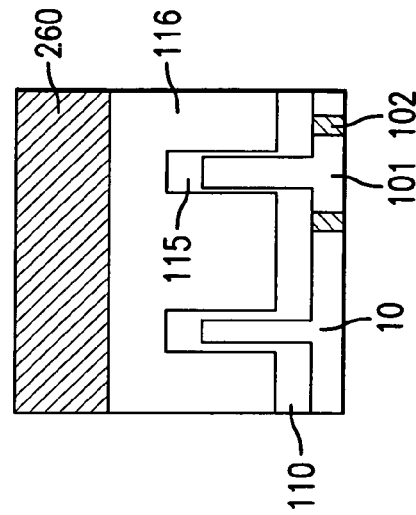
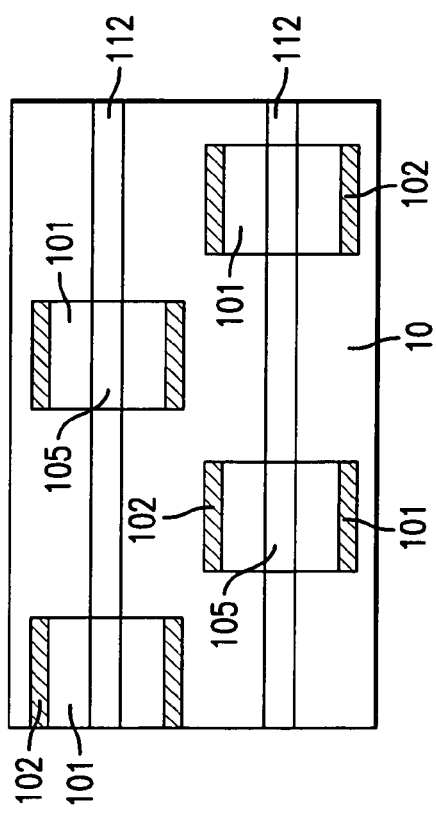
FIG.6C
FIG.6D

DRAM MEMORY CELL

CLAIM FOR PRIORITY

This application claims the benefit of priority to German Application No. 103 20 239.0, filed in the German language on May 7, 2003, the contents of which are hereby incorporated by reference.

TECHNICAL FIELD OF THE INVENTION

The invention relates to a DRAM memory cell having a planar selection transistor and a storage capacitor connected to the planar selection transistor.

BACKGROUND OF THE INVENTION

In order to obtain a sufficiently large read signal of the DRAM memory cell, the storage capacitor has to provide a sufficient storage capacitance. On account of the limited memory cell area, storage capacitors which utilize the third dimension are therefore used. One embodiment of such a three-dimensional storage capacitor is a so-called trench capacitor, which is arranged in a manner laterally adjoining the selection transistor, preferably essentially below the selection transistor, the inner capacitor electrode arranged in a trench being electrically conductively connected to the selection transistor. A further embodiment of a three-dimensional storage capacitor is the so-called stacked capacitor, which is likewise arranged in a manner laterally adjoining the selection transistor, preferably essentially above the selection transistor, the inner capacitor electrode being conductively connected to the selection transistor.

The selection transistor in the DRAM memory cell is generally a junction transistor in which two highly conductive doping regions are diffused into the semiconductor substrate and serve as current-supplying (source) and current-receiving (drain) electrodes, a current-conducting channel between source and drain electrodes being formed between the two doped regions with the aid of a gate electrode isolated by an insulating layer, in order to write and read the charge to and from the storage capacitor.

As the areas of the memory cells become smaller and smaller on account of increasing miniaturization, retaining the current driver capability of the transistor poses an increasing problem. Current driver capability of the transistor is understood to be the transistor's property of supplying, in the case of a predetermined source/drain potential and a predetermined gate voltage, a sufficient current in order to charge the storage capacitor sufficiently rapidly. However, the shrinking of the cell areas and the resultant shrinking of the transistor dimensions mean that the transistor width of the planar junction transistors decreases. This in turn has the effect of reducing the current switched through from the transistor to the storage capacitor. One possibility of retaining the current driver capability of the planar transistor with a reduced transistor width consists in correspondingly scaling the gate oxide thickness or the doping profile of the source/drain regions and of the channel region. However, there is the problem of increased leakage currents when the gate oxide thickness is reduced or the doping concentrations are higher.

As an alternative to planar DRAM selection transistors, therefore, vertically arranged transistors are increasingly being discussed in order, in the case of selection transistors, too, additionally to be able to utilize the third dimension and obtain larger transistor widths. In the case of such a vertical selection transistor, which, in the case of an assigned trench capacitor, is arranged essentially directly over the trench capacitor and, in the case of an assigned stacked capacitor, is arranged essentially directly under the stacked capacitor, there is, in particular, the possibility of enclosing the channel region of the transistor almost completely with the gate electrode, as a result of which the current driver capability per transistor area can be significantly increased. However, vertically embodied transistors are very complicated in terms of process engineering and can be fabricated only with difficulty, in particular with regard to the connection technique of the source/drain regions and of the gate electrodes of the transistor. What is more, there is the problem that, during the operations of switching the selection transistor on and off, the semiconductor substrate is also concomitantly charged at the same time, and the so-called floating body effect occurs, as a result of which the switching speed of the transistor is greatly impaired. In order to prevent this, the semiconductor substrate is generally provided with a substrate connection in order to ensure that the semiconductor substrate is discharged during the transistor switching operations. In the case of vertical selection transistors, however, there is the problem that even with the aid of such substrate connections, the semiconductor substrate can often be discharged only to an inadequate extent.

Furthermore, in particular in connection with logic circuits, new junction transistor concepts are known which can achieve a higher current intensity relative to the transistor width in comparison with the conventionally planar transistors. One possible short-channel junction transistor concept is the so-called double gate transistor, in which the channel region between source and drain regions is encompassed by a gate electrode at least on two sides, whereby a high current driver capability can be achieved even in the case of very short channel lengths since an increased channel width results in comparison with conventional planar selection transistors. In this case, it is preferred for the double gate transistor to be designed as a so-called Fin-FET, in which the channel region is embodied in the form of a fin between the source and drain regions, the channel region being encompassed by the gate electrode at least at the two opposite sides. Given a suitable design of the fin width and thus of the channel width, such a Fin-FET can be operated in such a way that, in the turned-on state with an applied gate electrode voltage, the two inversion layers that form under the gate electrodes overlap and a complete charge carrier inversion thus takes place, as a result of which the entire channel width can be utilized for current transport. What is more, Fin-FETs afford the possibility of directly controlling the so-called short-channel effects, which occur in the case of very short channel lengths and may lead to an alteration of the threshold voltage of the transistor, by means of the gate potential instead of, as in the case of conventional planar FETs, through the need to provide special doping profiles in the channel region of the transistor. An improved control of the short-channel effects is thus achieved with the aid of the Fin-FET. Furthermore, Fin-FETs are distinguished by a large subthreshold gradient and thus a good switch-on and switch-off behavior in conjunction with a reduced subthreshold leakage current. Not having to control short-channel effects by means of the channel doping additionally makes it possible to reduce the channel doping and thus to achieve a high channel mobility and a high threshold voltage.

Double gate transistors, in particular Fin-FETs, are generally fabricated on an SOI substrate (SOI=silicon on insulator) in order to avoid impairing the electrical properties of the double gate transistors. In the case of an SOI substrate, the silicon layer in which the transistor is formed is isolated from the underlying semiconductor wafer by a buried insulator layer. This configuration has the disadvantage that when the double gate transistor is intended to be used as a selection transistor for a DRAM cell, the silicon layer is charged as a result of the transistor being switched on and off, which significantly impairs the switching speed of the transistor. Although it is possible to avoid such charging of the silicon layer with the Fin-FET by means of an additional electrical connection, said additional connection can be effected only directly via the silicon surface, which results in an increased area requirement on account of the additional connection area, which is at odds with the desired miniaturization of the DRAM memory cell.

SUMMARY OF THE INVENTION

The invention relates to a DRAM memory cell having a planar selection transistor and a storage capacitor connected to the planar selection transistor. The stored information is represented by the charge of the storage capacitor, the storage states 0 and 1 corresponding to the positively and negatively charged storage capacitor, respectively. The storage capacitor is written to and read from by switching on the selection transistor. Since the capacitor charge of the storage capacitor decreases very rapidly on account of recombination and leakage currents, the charge is generally refreshed again with millisecond timing.

The present invention provides a DRAM memory cell with a reduced area requirement, the selection transistor formed in planar fashion being distinguished by a high current driver capability and charging of the semiconductor substrate being avoided at the same time.

According to another embodiment of the invention, a DRAM memory cell is formed having a selection transistor, which is arranged horizontally at a semiconductor surface and has a first source/drain electrode, a second source/drain electrode, a channel layer arranged between the first and the second source/drain electrode in the semiconductor substrate, and a gate electrode, which is arranged along the channel layer and is electrically insulated from the channel layer, the gate electrode enclosing the channel layer at at least two opposite sides. The selection transistor configured in this way is connected to a storage capacitor, which has a first capacitor electrode and a second capacitor electrode, insulated from the first capacitor electrode, one of the capacitor electrodes of the storage capacitor being electrically coupled to one of the source/drain electrodes of the selection transistor, and a further substrate electrode being provided on the rear side.

In the design according to the invention, in which a double gate transistor is formed directly on the semiconductor substrate without the interposition of an insulator layer, affords the possibility of using such a double gate transistor, which is distinguished by a high current driver capability, relative to the channel length, and improved electrical properties, particularly in the case of a short channel, in the case of DRAM memory cells and at the same time of providing for the possibility of using a semiconductor substrate electrode on the rear side to avoid charging of the semiconductor substrate as a result of the switching operations of the selection transistor.

In accordance with one preferred embodiment of the invention, the gate electrode is formed essentially in U-shaped fashion in cross section and encompasses the channel layer at three sides, as a result of which it is possible to achieve a higher current through the selection transistor and at the same time an improved control of short-channel effects. In this case, it is preferred for the gate electrode to be electrically conductively connected to a word line running transversely over the channel layer, as a result of which a particularly compact construction of the Fin-FET selection transistor is achieved.

In accordance with a further preferred embodiment, the channel layer is formed essentially in web-type fashion, the channel doping being embodied essentially homogeneously over the channel layer height. This ensures a threshold voltage of the selection transistor that is independent of the height of the channel.

In accordance with a further preferred embodiment, a doping of the channel web over the semiconductor substrate is embodied in such a way that the channel layer doping has a doping concentration of at most $1 \times 10^{17}$ cm$^{-3}$ over the height of the gate electrodes, while a doping concentration of at least $5 \times 10^{17}$ cm$^{-3}$ is embodied below the channel layer toward the semiconductor substrate. Such a doping profile enables a full depletion mode of the selection transistor, a high carrier mobility and thus a good current flow being ensured by the low doping in the channel region. At the same time, the high doping below the channel region toward the semiconductor substrate ensures that, in the case of high drain/source voltages, no breakdown occurs between the source and drain regions below the channel since the increased doping in this region provides for a sufficient blocking effect. In the case of such a channel doping with an elevated buried doping layer below the channel layer, it is possible to form double gate transistors with a channel layer length which corresponds to 2.5 times the channel layer thickness.

In accordance with a further preferred embodiment, the channel layer doping in the direction toward the source/drain electrode connected to the capacitor electrode is designed such that the doping atom concentration decreases, the doping atom concentration in the region of said source/drain electrode being at most $5 \times 10^{17}$ cm$^{-3}$. This design makes it possible to produce particularly short channel lengths since a relatively strong pn junction is present at the source/drain electrode connected to the bit line and provides for a rapid field decrease of the source/drain voltage, the low doping at the electrode connected to the capacitor electrode simultaneously ensuring that a sufficient charge carrier current can flow into the capacitor electrode. A channel doping configured in this way makes it possible to achieve channel layer lengths which have to correspond to the channel layer width.

In accordance with a further preferred embodiment, the storage capacitor of the DRAM memory cell is formed three-dimensionally either as a trench capacitor, which is arranged essentially below the Fin-FET selection transistor, or as a stacked capacitor, which is arranged essentially above the Fin-FET. The use of such three-dimensional storage capacitors provides for a sufficient storage capacitance in conjunction with a minimal area requirement for the memory cell.

It is furthermore preferred, in the case of a DRAM memory cell array, to arrange the DRAM memory cells in matrix-type fashion on the semiconductor substrate, in which case, when using trench capacitors, the trench capacitors are preferably arranged regularly in rows and the trench capacitors of adjacent rows are offset with respect to one another. After the formation of the trench capacitors, which are preferably provided with a buried plate, double gate selection transistors assigned to the trench capacitors are then formed such that firstly a strip-type hard mask layer is produced parallel to the rows of trench capacitors, the hard mask layer strips being arranged essentially between the rows of trench capacitors and the trench capacitors being partly covered. Afterward, spacer layers are produced at the steps of the hard mask layer strips and the uncovered semiconductor surfaces are etched down to a predetermined depth by means of anisotropic etching in the region between the hard mask layer strips and the adjoining spacer layers. The etched-free regions are then in turn filled with spacer layer material, the hard mask layer strips are subsequently removed and the surfaces uncovered under the hard mask layer strips are opened down to the predetermined depth by means of anisotropic etching. Afterward, the spacer layer material is then completely removed and an insulator layer is produced in large-area fashion. After the application of a polysilicon layer and the embodiment of a gate electrode patterning, the source/drain dopings are produced. By virtue of this procedure, DRAM memory cells having trench capacitors and double gate selection transistors can be produced in a simple manner using conventional DRAM process steps.

BRIEF DESCRIPTION OF THE DRAWINGS

The invention is explained in more detail with reference to the accompanying drawings, in which;

FIG. 2A shows a cross section of the embodiment in FIG. 2.

FIG. 2B shows a longitudinal section of the embodiment in FIG. 2.

FIGS. 3A and 3B show a DRAM memory cell according to the invention with a Fin-FET and a stacked capacitor.

FIG. 3A shows a cross section of the embodiment in FIG. 3.

FIG. 3B shows a longitudinal section of the embodiment in FIG. 3.

FIG. 4A shows a diagrammatic cross section through a Fin-FET.

FIG. 4B shows input characteristic curves on a logarithmic scale for various Fin-FET designs.

FIGS. 5A to 5E illustrate cross sections through the semiconductor wafer after different process steps.

FIGS. 6A to 6D show a second fabrication process according to the invention for forming a DRAM memory with Fin-FETs as selection transistors and trench capacitors as storage capacitors.

FIGS. 6A to 6D illustrate a plan view and a cross section through the semiconductor wafer after successive process steps.

DETAILED DESCRIPTION OF THE INVENTION

Dynamic memory cells are composed of a selection transistor and a storage capacitor. The storage states 0 and 1 correspond to the positively and negatively charged capacitor, respectively. However, the capacitor charge in the DRAM memory cells decreases after a few milliseconds on account of recombination and leakage currents, so that the charge of the capacitor has to be repeatedly refreshed.

After a read operation, too, the information has to be regularly rewritten to the capacitor of the DRAM memory cell.

Figure 1:
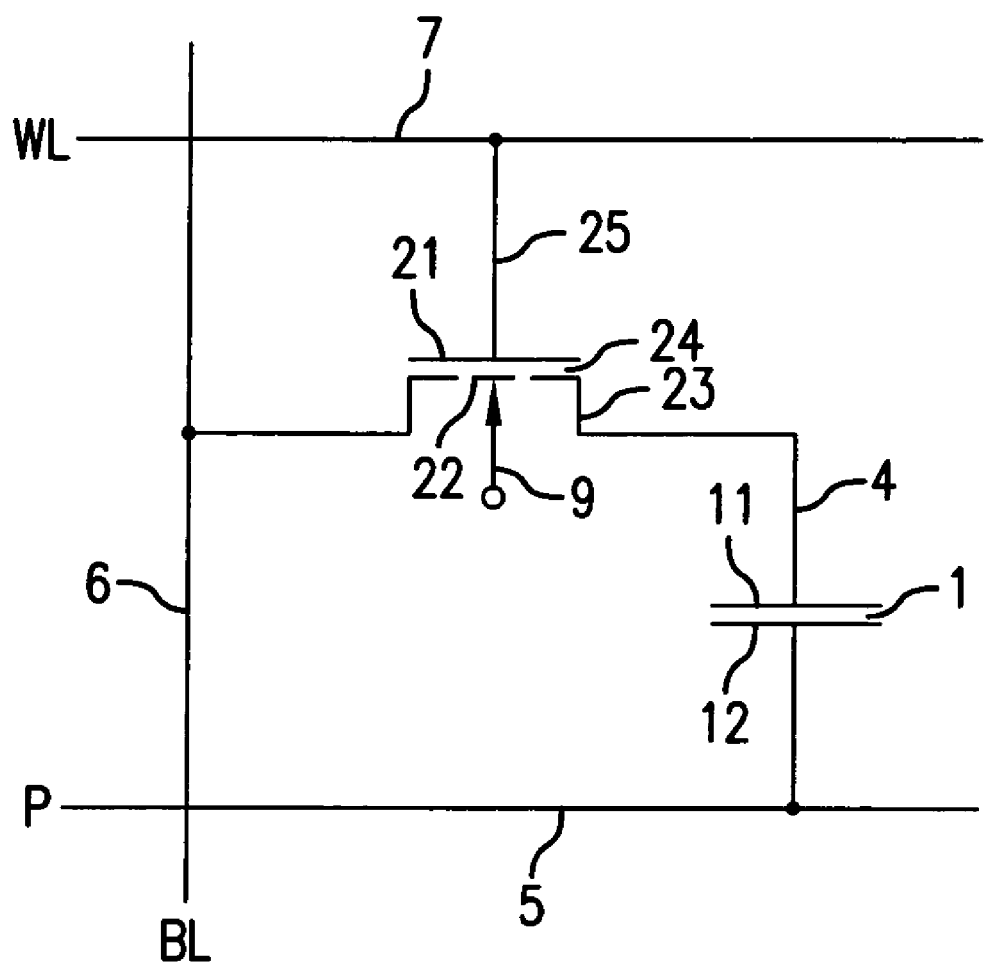
FIG. 1 shows a circuit diagram of a dynamic memory cell.

FIG. 1 shows the circuit diagram of a DRAM memory cell having a storage capacitor 1 and a selection transistor 2. In this case, the selection transistor 2 is preferably formed as a normally off n-channel field-effect transistor (FET) and has a first n-doped source/drain electrode 21 and a second n-doped source/drain electrode 23, between which an active weakly p-conducting region 22 is arranged. A gate insulator layer 24 is provided over the active region 22, a gate electrode 25 being arranged over the gate insulator layer, which gate electrode acts like a plate capacitor and can be used to influence the charge density in the active region 22.

The second source/drain electrode 23 of the selection transistor 2 is connected to the first electrode 11 of the storage capacitor 1 via a connecting line 4. A second electrode 12 of the storage capacitor 1 is in turn connected to a capacitor plate 5, which is preferably common to the storage capacitors of a DRAM memory cell arrangement. The first electrode 21 of the selection transistor 2 is further connected to a bit line 6 in order that the information stored in the storage capacitor 1 in the form of charges can be read in and out. A read-in and read-out operation is controlled via a word line 7 connected to the gate electrode 25 of the selection transistor 2 in order, by application of a voltage, to produce a current-conducting channel in the active region 22 between the first source/drain electrode 21 and the second source/drain electrode 23. In order to prevent the semiconductor substrate from being charged during the operations of switching the transistor on and off, a substrate connection line is further provided.

In the case of dynamic memory cells, the storage capacitors used are in many cases three-dimensional structures, in particular trench capacitors, which are arranged essentially below the selection transistor, and stacked capacitors, which are arranged essentially over the selection transistor, it thereby being possible to achieve a significant shrinking of the memory cell area. Even with a minimal memory cell area, such three-dimensional storage capacitors ensure a sufficiently large storage capacitance of approximately 25 to 40 fF, which provides for reliable detection of the information stored in the storage capacitor.

One difficulty in the case of the progressive shrinking of the cell area results, however, from the need to ensure a sufficient current driver capability of the selection transistor in order that the storage capacitors can be charged sufficiently rapidly. Selection transistors in DRAM memory cells are generally formed as planar n-channel field-effect transistors, two highly conductive n-type regions being diffused into a p-conducting semiconductor substrate and serving as current-supplying source electrode and current-receiving drain electrode. A dielectric layer, preferably a silicon dioxide layer, is applied over the region between the two highly n-conducting regions, the preferably metallic gate electrode being provided over said layer. Progressive miniaturization of such planar field-effect transistors gives rise to the problem that the current intensity, relative to the ever shorter channel lengths, no longer suffices to provide for rapid charging of the storage capacitors. What is more, there is the problem that a possible improvement of the current driver capability of planar transistors by reducing the gate oxide thickness or increasing the doping profiles would lead to intensified leakage currents.

According to the invention, therefore, the planar selection transistor is formed as a so-called double gate field-effect transistor, as a result of which it is possible to achieve significantly higher current intensities relative to the channel length in comparison with the conventional planar transistors. FIGS. 2 and 3 show two possible designs of a double gate field-effect transistor in a DRAM memory cell.

FIG. 2 illustrates a DRAM memory cell construction with a trench capacitor 100 as storage capacitor. The trench capacitor 100 has an inner capacitor electrode 101, which is preferably formed as a n-doped polysilicon filling. The inner capacitor electrode 101 is isolated from an outer capacitor electrode 103 by a dielectric layer 102, the outer capacitor electrode preferably being formed as a buried n-type doping in a semiconductor substrate 10 surrounding the trench capacitor. The upper region of the trench capacitor is surrounded by a thick insulation layer, preferably an oxide collar 104, which prevents an electrical short circuit between the buried outer capacitor electrode 103 and a selection transistor that controls the trench capacitor. The trench capacitor 100 is furthermore covered by an insulating covering layer 105.

Figure 2B:
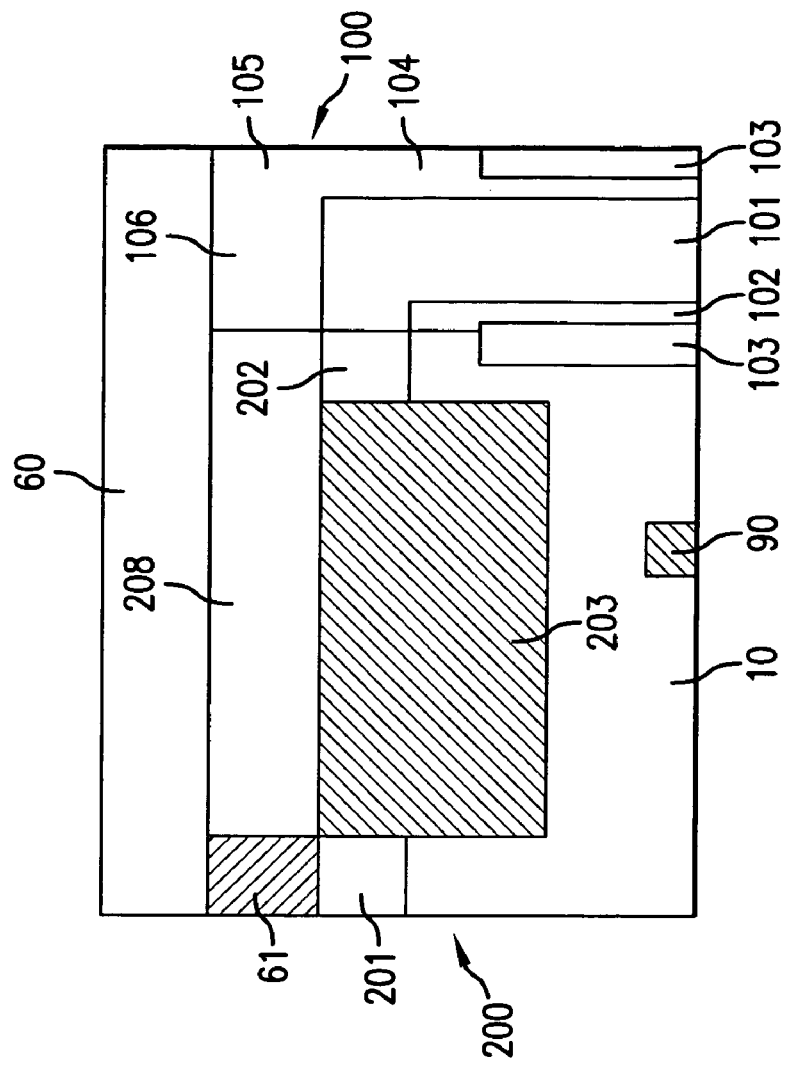
FIGS. 2A and 2B show a dynamic memory cell according to the invention with Fin-FET and trench capacitor.

The selection transistor 200, which is formed as a double gate field-effect transistor and is designed as a normally off n-MOS-FET, is arranged beside the trench capacitor 100 in the weakly p-doped semiconductor substrate 10. As shown in FIG. 2B, in particular, the selection transistor 200 has two highly n-doped regions 201, 202 at the semiconductor surface, which lie essentially in one plane with the trench capacitor. The two highly n-doped regions 201, 202 serve as first and second source/drain electrodes, the second source/drain electrode 202 being connected to the inner capacitor electrode 101 via a conductive connection 106 in the insulation collar 104, preferably a heavily n-doped polysilicon region. A channel region 203 is provided between the first and the second source/drain electrode 201, 202, which channel region is embodied in the form of a web in the semiconductor substrate 10, as shown by the cross section in FIG. 2A. Said channel region 203 extends between the first and the second source/drain electrode 201, 202 far into the semiconductor substrate 10 and, in a lower region 204, is laterally surrounded by a thick insulator layer 205, preferably an oxide layer, which is adjoined laterally by a thin gate oxide 206 in the upper channel region 203. The thin gate oxide 206 separates the upper channel region 203 from two lateral gate electrode sections 207 which encompass the upper channel region and are in turn laterally adjoined by a word line layer 70. In this case, the word line 70 runs essentially transversely with respect to the DRAM memory cell. An insulator layer 208, preferably a silicon nitride layer, is provided as a covering layer on the selection transistor 200, in which layer, in turn, a bit line 60 is arranged essentially along the DRAM memory cell, the bit line being connected to the first source/drain electrode 201 via a conductive contact connection 61. A substrate connection 90 is furthermore provided at the rear side of the semiconductor substrate 10.

FIG. 3 shows a second embodiment of a DRAM memory cell according to the invention with a double gate transistor. In this embodiment, as shown in particular by the longitudinal section in FIG. 3B, the storage capacitor 300 is formed as a stacked capacitor arranged essentially over a selection transistor 400. In this case, the stacked capacitor 300 has an inner capacitor electrode 301 at the semiconductor surface 10, which electrode has, in cross section, essentially the form of a crown (only partly shown) and preferably comprises a highly n-doped polysilicon layer. The inner capacitor electrode 301 is enclosed by a dielectric layer 302, which is in turn bordered by an outer capacitor electrode 303 (only partly shown) preferably embodied in block-type fashion, which outer capacitor electrode is formed as a highly n-doped polysilicon layer. The inner capacitor electrode 301 is connected via a contact block 304, preferably a highly n-doped polysilicon layer, to a second source/drain electrode 402 of the selection transistor 400 formed as a double gate FET.

The Fin-FET 400 is formed essentially along the semiconductor surface below the stacked capacitor 300 with two highly n-doped regions in the semiconductor substrate 10, which serve as first source/drain electrode 401 and as second source/drain electrode 402. An essentially plate-type channel region 403 is provided between the two highly doped regions 401, 402 and, as shown by the cross section in FIG. 3A, is formed as a web on the semiconductor substrate 10. In its lower region 404, the channel region is laterally bordered by an insulator layer 405, preferably an oxide layer, which is adjoined by a thin gate oxide layer 406 peripherally around the upper region of the channel 403. Said gate oxide layer 406 isolates the gate electrode 407, which is likewise formed around the channel region on three sides and is connected to a word line layer 71, which is formed over the gate electrode and runs essentially transversely with respect to the DRAM memory cell.

An insulator layer 408, preferably a silicon nitride layer, is in turn provided on the word line 71. The first source/drain electrode 401 of the double gate selection transistor is connected via a conductive contact block 63, preferably a highly doped polysilicon layer to a bit line 62, which runs essentially transversely with respect to the DRAM memory cell and is separated from the outer capacitor electrode 303 of the stacked capacitor 300 by a further insulator layer 64, preferably an oxide layer. An electrode region 91 for connection of the semiconductor substrate 10 is provided on the rear side of the semiconductor substrate.

The solution according to the invention of a DRAM memory cell having a storage capacitor that is preferably formed three-dimensionally and a selection transistor formed as a double gate field-effect transistor, the channel region of which is formed in the semiconductor substrate, the semiconductor substrate in turn being provided with a substrate connection, makes it possible, even in the case of short channel lengths, to ensure a sufficient current intensity between the source and drain regions of the double gate transistor and at the same time to prevent charging of the semiconductor substrate during the switching operations. The DRAM memory cell according to the invention can be restricted to a small substrate surface, a sufficient current driver capability with which the capacitor can be charged sufficiently rapidly simultaneously being ensured. Forming the double gate transistor directly on the semiconductor substrate as a web, the semiconductor substrate being provided with a substrate connection, ensures that the so-called floating body effect, i.e. charging of the surrounding semiconductor substrate, does not occur when the selection transistor is switched on and off.

The double gate transistor according to the invention can be fabricated simply and cost-effectively in the context of the known DRAM fabrication processes through simple modification of the process sequence for forming planar selection transistors. The selection transistor according to the invention, formed as a double gate field-effect transistor, is furthermore distinguished by improved electrical properties in comparison with conventional planar field-effect transistors. The gate electrode sections arranged on both sides of the channel afford the possibility of utilizing the entire channel width for forming a conductive channel layer for turning on the selection transistor, since charge carrier inversion can take place in the channel over the entire channel width and the entire channel can thus be utilized for current conduction. At the same time, such a so-called full depletion mode results in a good switch-on and switch-off behavior on account of the resultant high subthreshold gradient in conjunction with a low subthreshold leakage current. What is more, the short-channel effects that occur in the case of the short channel lengths can be controlled in a simple manner through the voltage control of the two lateral gate regions without having to provide a high doping in the channel region. This in turn ensures that a high threshold voltage and at the same time a high charge carrier mobility and thus a fast switching behavior of the selection transistor are achieved.

Figure 4A:
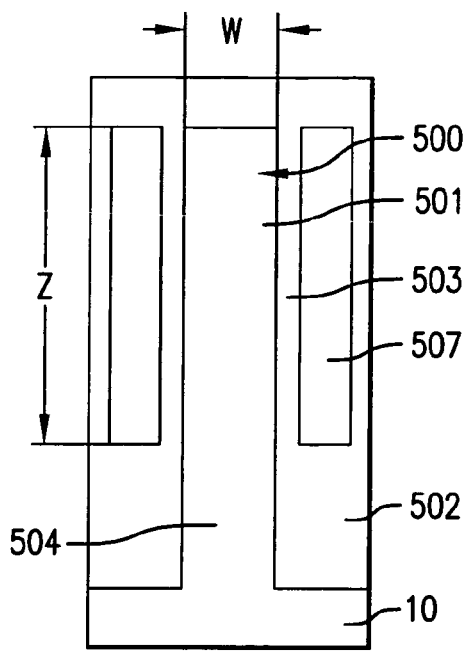
FIGS. 4A and 4B show configurations according to the invention of Fin-FETs as DRAM selection transistor.

By means of suitable doping profiles of the channel region of the double gate field-effect transistor according to the invention, it is furthermore possible to improve the current driver capability and also its switching behavior. FIG. 4A shows a cross section through a transistor structure which essentially corresponds to the first embodiment shown in FIG. 2 with a web-like channel region 500 on the semiconductor substrate, which is laterally enclosed in a lower region 504 by an insulator layer 502 adjoined by a thin gate oxide layer 503, which separate lateral gate electrode sections 507 from an upper channel region 501. In this case, the channel region has a channel width W and a channel height Z, corresponding to the height of the gate electrode section 507.

Figure 4B:
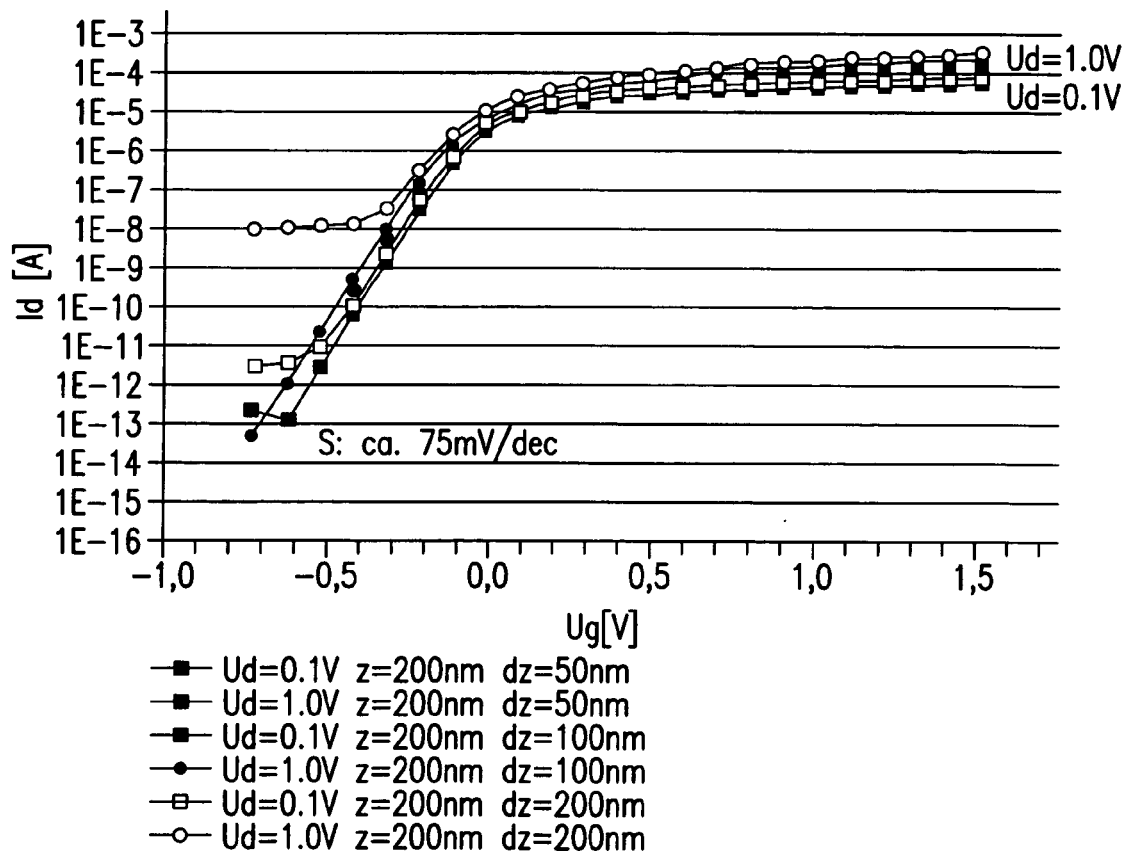

FIG. 4B shows, on a logarithmic scale, input characteristic curves on such a Fin-FET in the case of a channel length L of 50 nm and a channel width W of 20 nm. In this case, the source/drain electrodes are arsenic-doped n-type regions having a doping concentration of $2\times10^{20}$ cm$^{-3}$. The silicon substrate 10 with the channel region lying between the source/drain electrodes is weakly p-doped, preferably with boron with a doping concentration of $5\times10^{13}$ cm$^{-3}$, the doping decreasing from the first source/drain electrode, connected to the bit line, toward the second source/drain electrode, connected to the storage capacitor, preferably with a gradient of 3.5 nm/dec. Furthermore, the doping increases under the channel toward the substrate with a rise of 14 nm/dec. The channel height is 200 nm.

FIG. 4B illustrates the source/drain current $I_d$ for two source/drain voltages $U_d$ 0.1 and 1 volt and for three different depths of the source/drain implantation of 50 nm, 100 nm and 200 nm relative to the gate voltage $U_g$. It is found in this case that a shallow doping, in comparison with a deep doping of the source/drain regions, leads to a lower current flow but to an improved breakdown behavior and vice versa. Therefore, the doping depth of the source/drain regions is preferably chosen in such a way as to ensure a current intensity that is high enough for charging the capacitor whilst at the same time avoiding a breakdown between source/drain electrode in the selection transistor. Furthermore, FIG. 4B reveals that the design according to the invention with a double gate field-effect transistor leads to a good subthreshold gradient of approximately 75 mV/dec.

In one preferred embodiment, the double gate field-effect transistor according to the invention is formed such that the channel layer has an essentially homogeneous doping with a doping concentration of $1\times10^{17}$ cm$^{-3}$, a doping concentration of $5\times10^{17}$ cm$^{-3}$ being present in the web region below the gate electrodes. Such a doping profile makes it possible to achieve a channel-layer-length-to-channel-layer-width ratio of 2.5, a sufficiently high current intensity simultaneously being ensured whilst avoiding a breakdown below the channel region.

In accordance with a second preferred embodiment, a doping profile which decreases toward the source/drain electrode connected to the capacitor electrode is provided in the channel layer, the doping concentration in the region of the source/drain electrode connected to the capacitor electrode being at most $5\times10^{17}$ cm$^{-3}$. Such a doping gradient of the channel layer makes it possible to achieve a channel-layer-length-to-width ratio of 1, a sufficiently high current intensity for charging the capacitor simultaneously being ensured whilst preventing a breakdown below the channel layer.

FIGS. 5A to E show a possible process sequence for forming a dynamic memory cell according to the invention in a DRAM memory, the memory cell being provided with a trench capacitor. In this case, the individual structures of the dynamic memory cell are preferably formed with the aid of silicon planar technology, which comprises a sequence of individual processes acting in each case over the whole area at the surface of a silicon semiconductor wafer, a local alteration of the silicon substrate being carried out in a targeted manner by means of suitable masking layers. A multiplicity of dynamic memory cells are preferably formed simultaneously during the DRAM memory fabrication. The invention is explained below using the example of forming two memory cells that are connected to one another via a common bit line. FIGS. 5A to 5E in each case show a cross section through the silicon wafer after the last individual process respectively described. In this case, the process steps for forming the dynamic memory cell which are essential to the invention are discussed below. Unless explained otherwise, the structures are formed in the context of the customary DRAM process sequence.

Figure 2A:
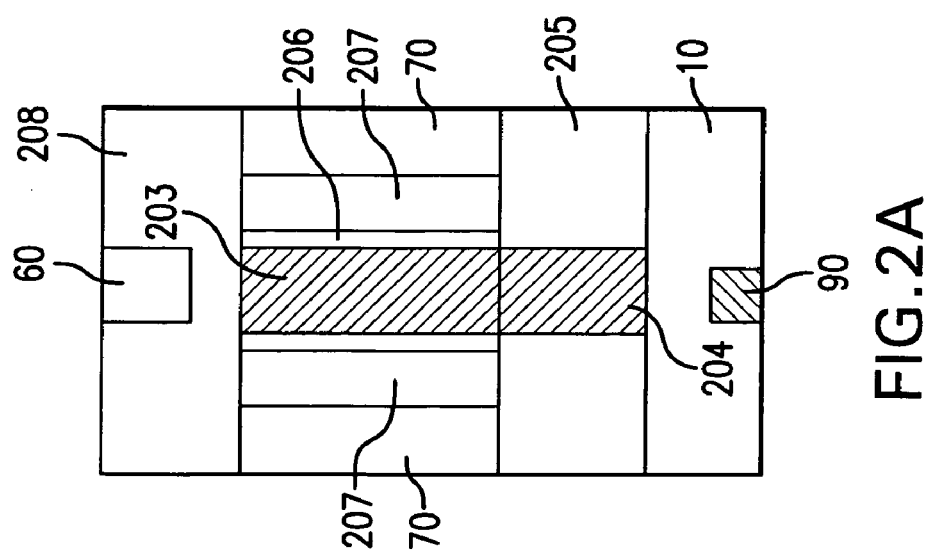
Figure 5A:
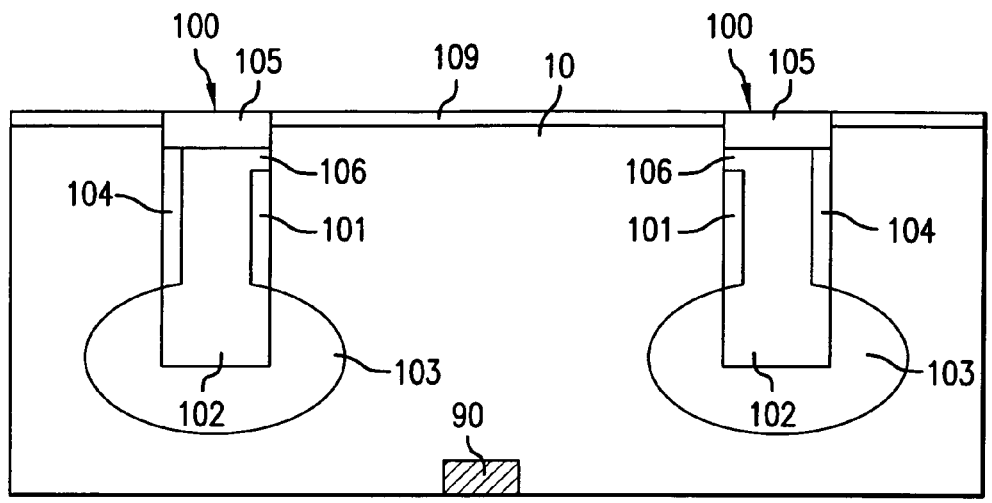
FIGS. 5A and 5B show a first fabrication process according to the invention for forming a DRAM memory with Fin-FETs as selection transistors and trench capacitors as storage capacitors.

FIG. 5A shows a cross section through the silicon wafer, which is preferably a monocrystalline silicon substrate 10 having a weak p-type doping. Trench capacitors 100, corresponding to the trench capacitors shown in FIG. 2A, are embodied in the silicon wafer 10. The trench capacitors are fabricated in the context of conventional trench processing by means of photolithography technology, a one-sided trench connection 106 in each case being formed at opposite sides. In this case, the two trench capacitors 100 shown are embodied in such a way that the trenches are filled with a highly n-doped polysilicon layer, preferably arsenic or phosphorus being used for doping, the filling serving as an inner capacitor electrode 101. In the lower region, the polysilicon filling 101 is surrounded by a dielectric layer 102, which may comprise a stack of dielectric layers and is distinguished by a high dielectric constant.

A highly n-doped layer 103, serving as a second capacitor electrode, is formed in turn around the dielectric layer 102. A collar oxide layer 104 is formed around the inner capacitor electrode 101 in a manner adjoining the dielectric layer 102, the capacitor connection 106 being provided in said collar oxide layer on one side. The trench capacitor 100 is furthermore covered with an oxide layer 105. A substrate connection 90, preferably in the form of a highly p-doped region, is formed on the rear side of the weakly p-doped semiconductor substrate 10. A thin oxide layer 109 is additionally provided around the trench capacitors on the semiconductor surface.

Figure 5B:
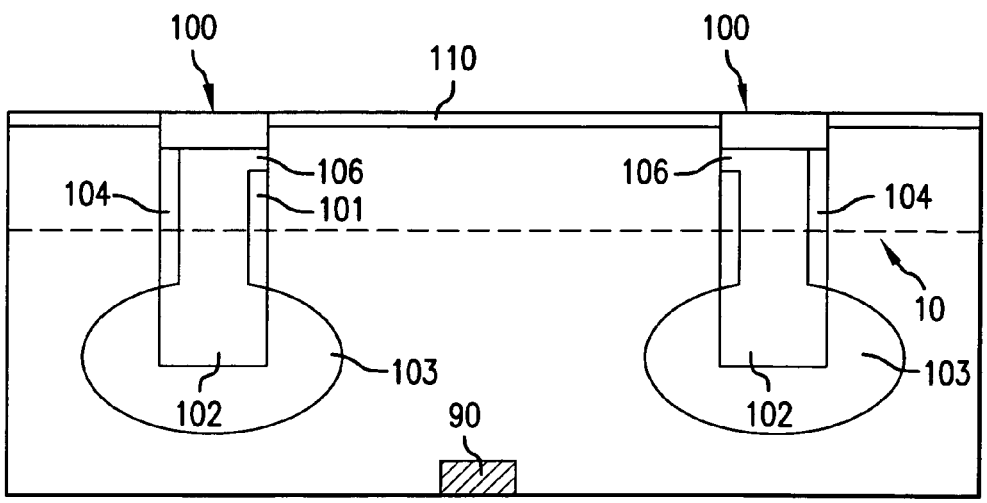

In a further process sequence, selection transistors designed as double gate field-effect transistors are then formed between the two trench capacitors 100. For this purpose, after eliminating the oxide layer 109, by means of a first lithography step, the channel layer formed in web-type fashion is defined in the silicon substrate 10. Afterward, trenches are embodied in the semiconductor substrate by means of an anisotropic etching, which trenches define the channel layer regions. The etching depth is depicted in dotted fashion in FIG. 5B. After eliminating the photolithography mask, a thin oxide layer 110 is in turn formed on the silicon wafer 10. A cross section through the silicon wafer after this process step is shown in FIG. 5B.

Figure 5C:
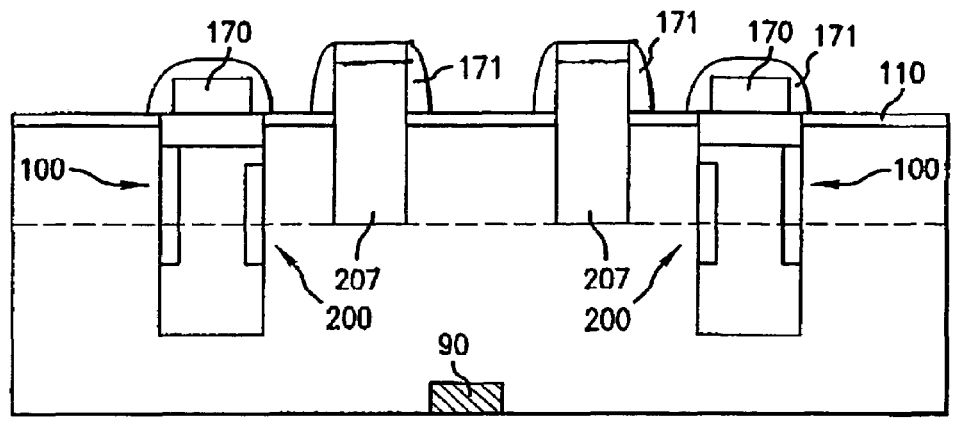

In a further process sequence, a gate oxide layer is then produced by oxidation laterally around the etched-free channel layers and a polysilicon deposition is subsequently performed in order to produce the gate electrodes. Furthermore, a high n-type doping, preferably with phosphorus, is embodied in the polysilicon layer. After a gate lithography in which the regions of the gate electrodes are defined around the channel layer but spaced apart from the two trench capacitors, the gate electrodes 207 with the underlying gate oxides are etched free. Over the gate electrodes 207, the word lines are then fabricated, in a manner running transversely with respect to the memory cells, in the form of a further highly doped polysilicon layer 170. FIG. 5 shows a cross section through the semiconductor wafer in which four word lines 170 are formed on the semiconductor surface, two over the corresponding gate electrodes 207 of the double gate field-effect transistors and two over the laterally arranged trench capacitors 100, which serve for the connection of the next row of DRAM memory cells arranged in the form of a checkerboard. The word lines 170 are enclosed by a silicon spacer layer 171 formed by application of a silicon nitride layer and subsequent etching-back. A cross section through the silicon wafer after the spacer processing is shown in FIG. 5C.

Figure 5D:
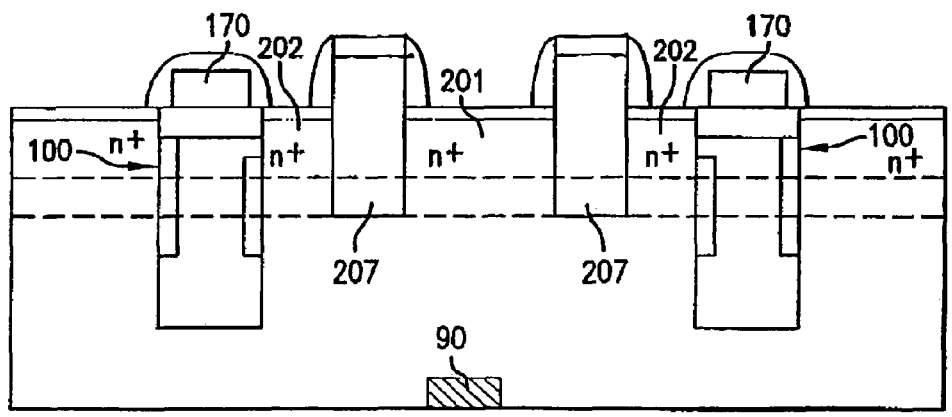
Figure 5E:
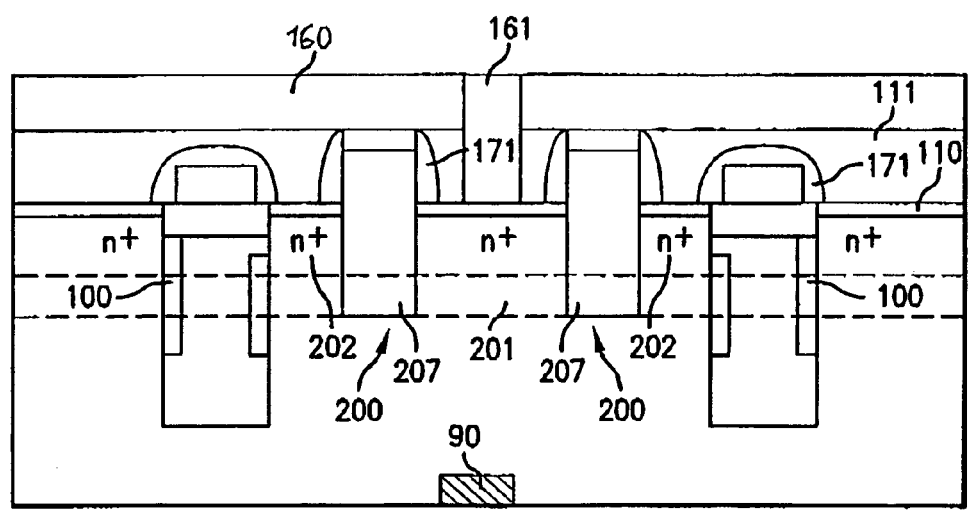

Through the remaining silicon oxide layer 110, the source/drain electrodes 201, 202 of the n-channel transistors are then embodied e.g. by means of ion implantation with arsenic. A cross section through the silicon wafer with the highly n-doped source/drain electrodes is shown in FIG. 5D. In this case, three doped regions are formed between the two trench capacitors 100, the two doping regions 202 adjoining the trench capacitors serving as second source/drain electrodes of the two selection transistors 200. The highly n-doped region 201 formed between the two channel regions serves as a common first source/drain electrode for both selection transistors 200. The common source/drain electrode 201 is then connected to a bit line in a further process sequence, an oxide layer 111 being applied in a first process step, a metal block 161 for making contact with the first source/drain electrode 201 being embodied in said oxide layer in a self-aligning manner, the bit line track 160 being embodied, in turn, on said metal block in a manner such that it runs transversely. A cross section through the silicon wafer after this process step is shown in FIG. 5E.

An alternative embodiment for fabricating a DRAM memory cell according to the invention in a DRAM memory having a double gate field-effect transistor and a trench capacitor is illustrated in the process sequence 6A to 6D. The individual figures show in each case a diagrammatic plan view of the silicon wafer 10 and a cross section after the last process step respectively explained. In this case, in a manner similar to the process sequence illustrated in FIG. 5, an arrangement of trench capacitors 100 is embodied on the silicon wafer 10, a multiplicity of trench capacitors being arranged regularly in rows and adjacent rows of trench capacitors being embodied in offset fashion. Each trench capacitor 100 has an inner capacitor electrode 101, which is preferably embodied as a highly n-doped polysilicon block separated from an outer electrode 103, embodied as a doping region in the lower region (not shown), by a lateral dielectric layer 102. A block-type oxide covering layer 105 is embodied on the trench capacitor 100, the layer being surrounded by a silicon nitride layer 112. The silicon wafer with the trench capacitors 100 embodied in this way is illustrated in FIG. 6A.

In a next process step, a hard mask lithography process is then used to fabricate strip-type hard mask layers 113, preferably made of SiON or a so-called low-K material, the hard mask layers 113 running in strip-type fashion parallel to the rows of trench capacitors 100. In this case, the hard mask layer strips 113 are arranged essentially between the rows of trench capacitors and partly cover the trench capacitors. Spacer layers 114 are produced at the steps of the hard mask layer strips 113 by application of an oxide layer and subsequent etching-back. A plan view of the semiconductor wafer and a detail cross section after this process step are illustrated in FIG. 6B.

An anisotropic etching step is performed next in order to open the surface that is uncovered between the hard mask layer strips 113 and the adjoining spacer layers 114 as far as a predetermined depth in the silicon substrate 10. In a further process step, the etched-free region between the hard mask layer strips 113 and the adjoining spacer layers 114 is then in turn filled with the silicon dioxide used as spacer layer material and the hard mask layer strips are then removed. Trenches having the same depth as in the first etching step are then once again embodied by means of subsequent anisotropic etching of the surface that is uncovered under the hard mask layer strips. The spacer layer material is then removed. A plan view of the semiconductor wafer and a cross section through the semiconductor wafer after this process step are shown in FIG. 6C.

In a further process sequence, silicon dioxide 115 is then applied in large-area fashion as insulator layer and gate oxide layer. A polysilicon layer 116 is subsequently deposited and planarized. The polysilicon layer 116 is doped and patterned in a further lithography process in order to form the lateral gate electrodes and the word lines running transversely, in a manner similar to that in the case of the process sequence illustrated in FIG. 5. In the uncovered regions between the word lines with the underlying gate electrodes, the source/drain implants are then embodied and subsequently covered with an insulator layer 117, through which one source/drain electrode of the transistor is then contact-connected to a subsequently applied bit line 260 with the aid of contact blocks. A plan view and a cross section through the silicon wafer after this concluding process step for forming the dynamic memory cells are shown in FIG. 6D.

In addition to the two process sequences shown with reference to FIGS. 5 and 6 for forming dynamic memory cells with a three-dimensional storage capacitor and a planar double gate selection transistor, it is also possible to have recourse to other process sequences for forming three-dimensional storage capacitors and double gate selection transistors. Furthermore, it is possible for the conductivity type of the doped regions in the memory cells to be embodied in complementary fashion. What is more, the materials specified for forming the various layers may be replaced by other materials that are known in this connection.

What is claimed is:

1. A DRAM memory cell, comprising:
   a selection transistor, which is arranged horizontally at a semiconductor substrate surface and has a first source/drain electrode;

a second source/drain electrode;

a channel layer arranged between the first and the second source/drain electrode in the semiconductor substrate;

a gate electrode, which is arranged along the channel layer and is electrically insulated from the channel layer;

a storage capacitor, which has a first capacitor electrode and a second capacitor electrode, insulated from the first capacitor electrode, one of the capacitor electrodes of the storage capacitor being electrically conductively connected to one of the source/drain electrodes of the selection transistor; and a semiconductor substrate electrode on a rear side, wherein the gate electrode encloses the channel layer at at least two opposite sides.

2. A DRAM memory cell, comprising:

a selection transistor, which is arranged horizontally at a semiconductor substrate surface and has a first source/drain electrode;

a second source/drain electrode;

a channel layer arranged between the first and the second source/drain electrode in the semiconductor substrate;

a gate electrode, which is arranged along the channel layer and is electrically insulated from the channel layer;

a storage capacitor, which has a first capacitor electrode and a second capacitor electrode, insulated from the first capacitor electrode, one of the capacitor electrodes of the storage capacitor being electrically conductively connected to one of the source/drain electrodes of the selection transistor; and a semiconductor substrate electrode on a rear side, wherein the gate electrode encloses the channel layer at at least two opposite sides, wherein the gate electrode is formed essentially in U-shaped fashion in cross section and encloses the channel layer at three sides.

3. The DRAM memory cell as claimed in claim 1, wherein a word line that is electrically conductively connected to the gate electrode runs transversely over the channel layer.

4. The DRAM memory cell as claimed in claim 1, wherein the channel layer is formed essentially in web-type fashion on the semiconductor substrate.

5. The DRAM memory cell as claimed in claim 1, wherein the channel layer has an essentially homogeneous doping over the channel layer height.

6. The DRAM memory cell as claimed in claim 1, wherein the channel layer doping has a doping atom concentration of at most $1*10^{17}$ cm$^{-3}$ and a doping atom concentration of at least $5*10^{17}$ cm$^{-3}$ is present below the channel layer.

7. The DRAM memory cell as claimed in claim 6, wherein the channel layer length corresponds at least to 2.5 times the channel layer width.

8. The DRAM memory cell as claimed in claim 1, wherein the channel layer doping decreases over the channel layer length toward the source/drain electrode connected to the capacitor electrode, the doping atom concentration at the source/drain electrode connected to the capacitor electrode being at most $5*10^{17}$ cm$^{-3}$.

9. The DRAM memory cell as claimed in claim 8, wherein the channel layer length corresponds at least to the channel layer width.

10. The DRAM memory cell as claimed in claim 1, wherein the storage capacitor is formed as a trench capacitor arranged in a manner laterally adjoining the selection transistor, an inner capacitor electrode arranged in a trench being electrically conductively connected to one source/drain electrode.

11. The DRAM memory cell as claimed in claim 10, wherein one source/drain electrode is arranged over an inner capacitor electrode arranged in the trench.

12. The DRAM memory cell as claimed in claim 1, wherein the storage capacitor is formed as a stacked capacitor arranged in a manner laterally adjoining the selection transistor, an inner capacitor electrode being electrically conductively connected to one source/drain electrode.

13. A DRAM memory having a plurality of DRAM memory cells, the DRAM memory cells are arranged in matrix-type fashion on a semiconductor substrate and comprise:

a selection transistor, which is arranged horizontally at a semiconductor substrate surface and has a first source/drain electrode;

a second source/drain electrode;

a channel layer arranged between the first and the second source/drain electrode in the semiconductor substrate;

a gate electrode, which is arranged along the channel layer and is electrically insulated from the channel layer;

a storage capacitor, which has a first capacitor electrode and a second capacitor electrode, insulated from the first capacitor electrode, one of the capacitor electrodes of the storage capacitor being electrically conductively connected to one of the source/drain electrodes of the selection transistor; and a semiconductor substrate electrode on a rear side, wherein the gate electrode encloses the channel layer at at least two opposite sides.

* * * * *